(12) United States Patent
He

(10) Patent No.: US 8,493,271 B2  
(45) Date of Patent: Jul. 23, 2013

(54) ELECTROMAGNETIC RADIATION MEASURING DEVICE FOR ELECTRONIC DEVICES

(75) Inventor: Xiao-Lian He, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 187 days.

(21) Appl. No.: 13/220,714

(22) Filed: Aug. 30, 2011

(65) Prior Publication Data  
US 2013/0002495 A1    Jan. 3, 2013

(30) Foreign Application Priority Data  
Jun. 30, 2011 (CN) .......................... 2011 1 0181617

(51) Int. Cl.  
*G01R 29/10* (2006.01)

(52) U.S. Cl.  
USPC ........... 343/703; 343/853; 342/170; 342/360; 455/67.11; 455/67.15; 455/67.12

(58) Field of Classification Search  
None  
See application file for complete search history.

(56) References Cited

U.S. PATENT DOCUMENTS

| | | | | |
|---|---|---|---|---|
| 6,023,203 A | * | 2/2000 | Parish | 333/126 |
| 6,313,799 B1 | * | 11/2001 | Thimm et al. | 343/703 |
| 6,445,357 B1 | * | 9/2002 | Sinclair | 343/820 |
| 6,911,954 B2 | * | 6/2005 | Li | 343/853 |
| 8,284,108 B2 | * | 10/2012 | Woo | 343/703 |
| 8,392,134 B2 | * | 3/2013 | Li et al. | 343/703 |
| 8,400,366 B2 | * | 3/2013 | Kitada | 343/703 |
| 8,405,560 B2 | * | 3/2013 | Sakata et al. | 343/703 |

* cited by examiner

*Primary Examiner* — Trinh Dinh  
(74) *Attorney, Agent, or Firm* — Altis Law Group, Inc.

(57) ABSTRACT

An electromagnetic radiation measuring device includes a test antenna module and a main processor electrically connected to the test antenna module. The test antenna module includes a plurality of pre-test antennas and at least one final test antenna, which have predetermined polarities and are positioned at predetermined heights, respectively. The pre-test antennas and the final test antenna respectively receive wireless signals sent from an electronic device. The main processor measures and records a frequency of the strongest wireless signal received by selected ones of the pre-test antennas that have the same polarity, and further determines whether power of wireless signals at the recorded frequency received by the final test antenna polarized to have the same polarity as that of the selected ones of the pre-test antennas exceeds a predetermined acceptable range.

13 Claims, 3 Drawing Sheets

ELECTROMAGNETIC RADIATION MEASURING DEVICE FOR ELECTRONIC DEVICES

BACKGROUND

1. Technical Field

The present disclosure relates to quality testing for electronic devices, and particularly to an electromagnetic radiation measuring device for electronic devices.

2. Description of Related Art

Many methods for measuring the strength of the electromagnetic radiation of electronic devices include pre-test steps and final test steps. Generally, the pre-test steps are used to evaluate the working frequencies of the electronic devices that may cause the electronic devices to generate excessive electromagnetic radiation, and the final test steps are used to identify whether the electronic devices indeed generate an excessive amount of electromagnetic radiation when the electronic device are working at the working frequencies previously evaluated.

A pre-test step for measuring the electromagnetic radiation of an electronic device generally includes operations such as, a test antenna is successively polarized in different types in a predetermined sequence, for example, first vertically polarized and then horizontally polarized. Because the electronic device may generate electromagnetic radiation in different polarization types (e.g., vertical polarization and horizontal polarization), the test antenna in the different polarization types can respectively receive the electromagnetic radiation in the different polarization types. In each of the two polarization types, the test antenna is respectively positioned at a plurality of predetermined heights (e.g., respectively positioned at heights of 1 m, 2 m, 3 m, and 4 m) to receive wireless signals (i.e., the electromagnetic radiation) sent from the electronic device at each of the predetermined heights. The electronic device can be rotated to adjust the angle of signal emission of the electronic device relative to the test antenna and to maximize power of the wireless signals sent to the test antenna. All the signals received by the test antenna are amplified and transmitted to a measuring device, such as a spectrum analyzer. The measuring device analyzes the signals to find a strongest signal (i.e., a signal with maximum power) that has been received by the test antenna in each of the two polarization types. The frequencies of the strongest signals received by the test antenna in each of the two polarization types are recorded as the working frequencies at which the electronic device may generate excessive electromagnetic radiation.

In the final test step, the test antenna is successively vertically polarized and horizontally polarized again, and is used to receive wireless signals at the recorded frequencies sent from the electronic device in both the two polarization types. In each of the two polarization types, the test antenna is respectively positioned at a plurality of predetermined heights (e.g., heights of 1 m, 2 m, 3 m, and 4 m) to receive wireless signals sent from the electronic device at each of the predetermined heights. As before, the electronic device is rotated to adjust the angle of signal emission of the electronic device relative to the test antenna and maximize power of the wireless signals sent to the test antenna, such that the test antenna receives strongest signals at the recorded frequencies (i.e., signals at the recorded frequencies with maximum power) from the electronic device at each of the predetermined heights. The measuring device determines whether or not the power of the strongest signals at the recorded frequencies exceeds a predetermined acceptable point or range. If the power of the strongest signals at the recorded frequencies received from the electronic device does exceed the acceptable point or range, the measuring device determines that the electronic device generates excessive electromagnetic radiation and is unable to pass the test.

In the aforementioned test process, the test antenna needs many polarization operations, height adjusting operations, and rotation operations. Therefore, the test process may take too much time and be carried out inefficiently.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the figures.

DETAILED DESCRIPTION

Figure 1:
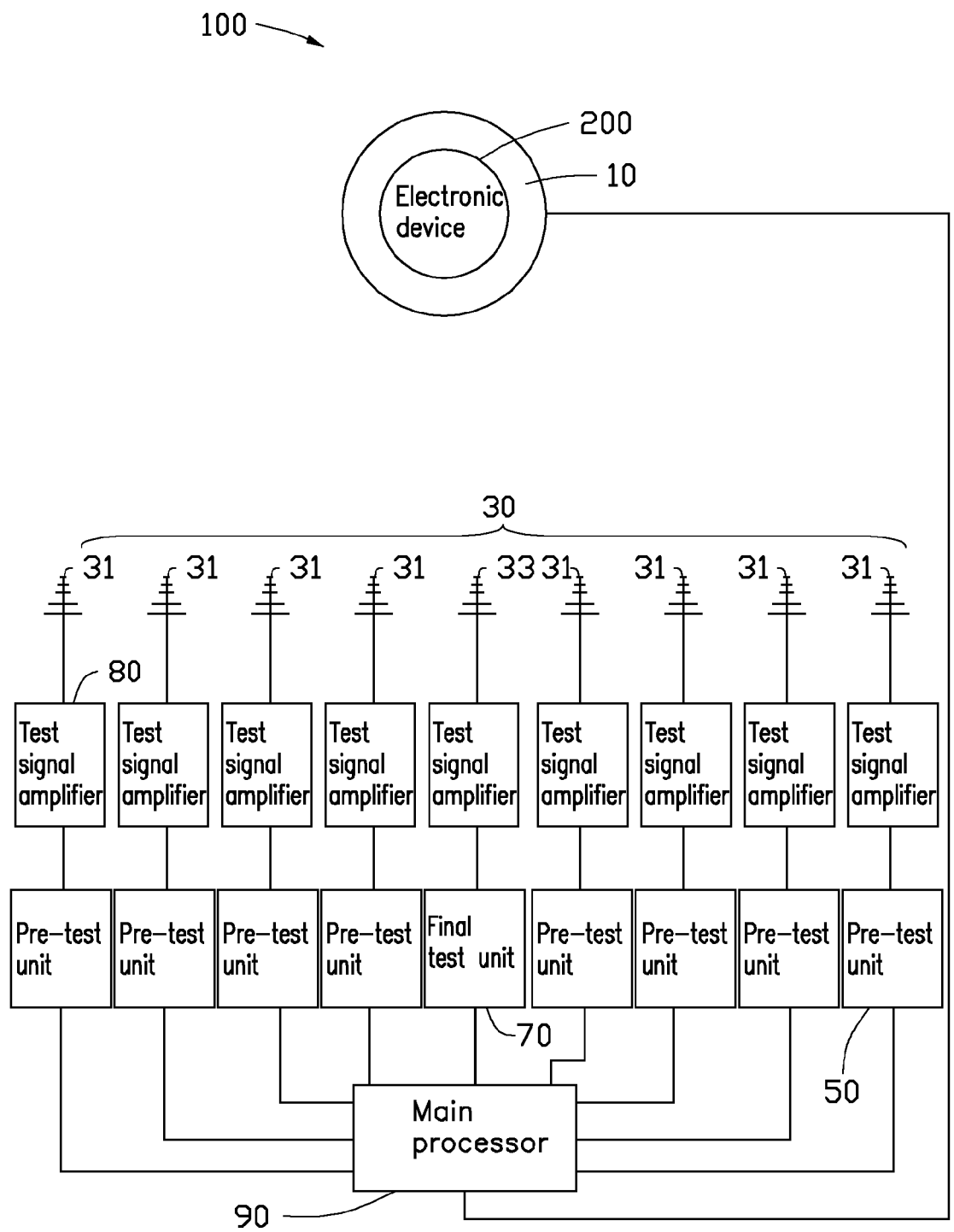
FIG. 1 is a block diagram of an electromagnetic radiation measuring device, according to an exemplary embodiment, which is used to measure the electromagnetic radiation of an electronic device.

FIG. 1 is a block diagram of an electromagnetic radiation measuring device 100, according to an exemplary embodiment. The electromagnetic radiation measuring device 100 can be used to measure amount and strength of electromagnetic radiation emitted from an electronic device 200, such as a mobile phone or a personal computer (PC), and determine whether the electronic device 200 is generating an excessive amount of electromagnetic radiation in different polarization types, such as vertical and horizontal polarization types.

The electromagnetic radiation measuring device 100 includes a rotation unit 10, a test antenna module 30, a plurality of pre-test units 50, at least one final test unit 70, a plurality of test signal amplifiers 80, and at least one main processor 90. In this embodiment, the pre-test units 50 and the final test unit 70 can be spectrum analyzers, and the main processor 90 can be a personal computer.

The rotation unit 10 can be an electrical rotation device, such as an electric motor. The rotation unit 10 is electrically connected to the main processor 90. The electronic device 200 is positioned on the rotation unit 10, and the main processor 90 can control the rotation unit 10 with the electronic device 200 to rotate, such that the angle of signal emission of the electronic device 200 relative to the test antenna module 30 can be adjusted.

The test antenna module 30 includes a plurality of pre-test antenna 31 corresponding to the pre-test units 50 and at least one final test antenna 33 corresponding to the final test unit 70. The test signal amplifiers 80 are configured to be corresponding to the pre-test antennas 31 and the final test antenna 33. Each of the pre-test antennas 31 is electrically connected to a corresponding one of the pre-test units 50 through a corresponding one of the test signal amplifiers 80, and the final test antenna 33 is electrically connected to the final test unit 70 via a corresponding one of the test signal amplifiers

80. The pre-test units 50 and the final test unit 70 are all electrically connected to the main processor 90.

Figure 2:
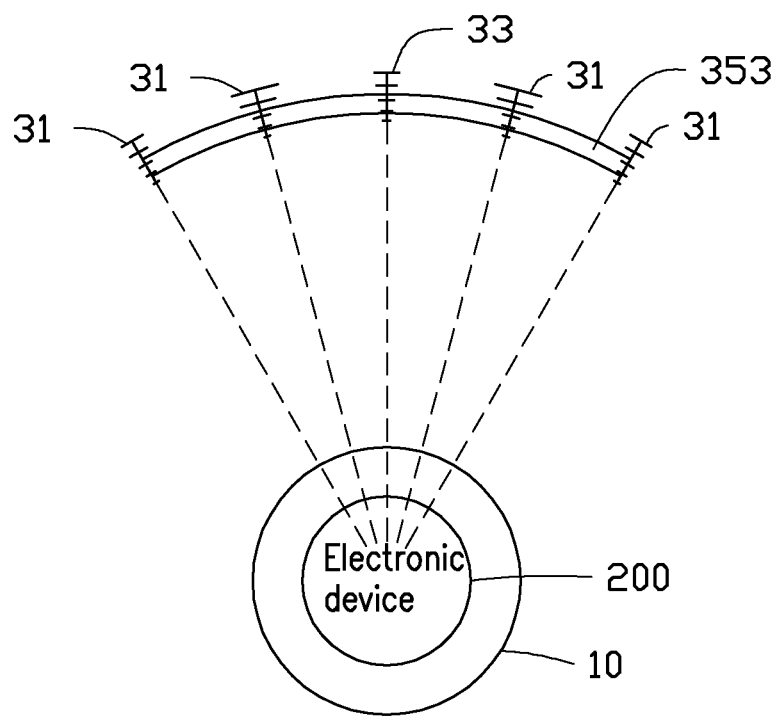
FIG. 2 is schematic view of the spatial relations between the test antennas of the electromagnetic radiation measuring device and the electronic device shown in FIG. 1.
Figure 3:
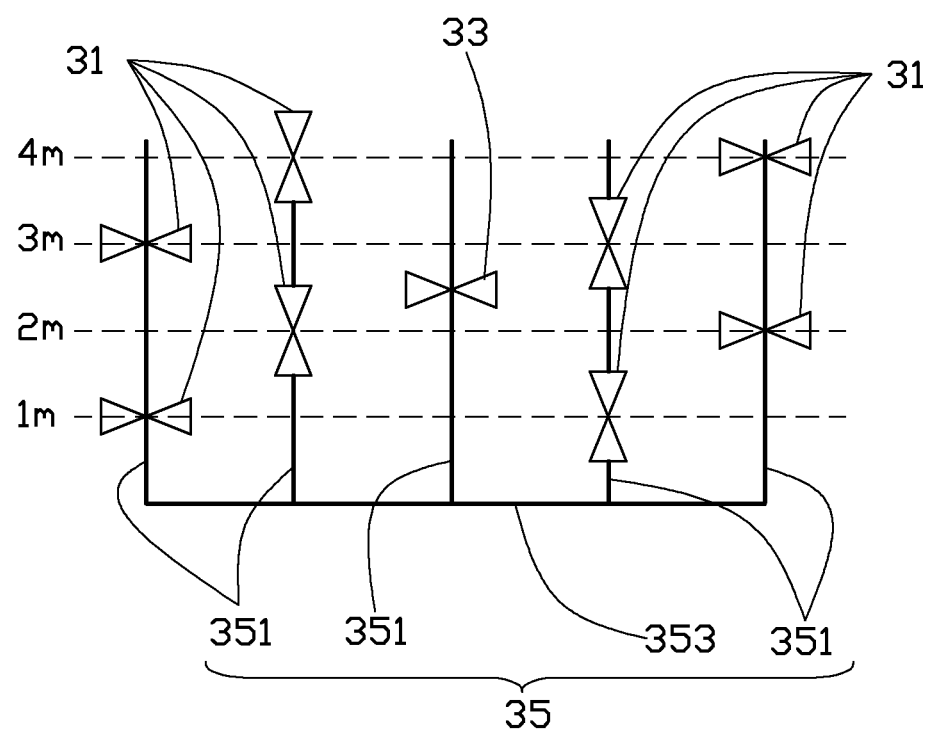
FIG. 3 is a schematic view of the positioning at predetermined heights of the test antennas of the electromagnetic radiation measuring device shown in FIG. 1.

Also referring to FIG. 2 and FIG. 3, the test antenna module 30 further includes an antenna holder 35. The antenna holder 35 includes a plurality of holding poles 351 and a holding base 353. The holding base 353 is arc-shaped, and the holding poles 351 are equidistantly mounted on the holding base 353, arranged from one end of the holding base 353 to the other. The final test antenna 33 is mounted on a middle one of the holding poles 351, and a height of the final test antenna 33 on the holding pole 351 is adjustable. The pre-test antennas 31 are equally mounted on the others of the holding poles 351, and heights of the pre-test antennas 31 on the holding poles 351 are adjustable. In this embodiment, the test antenna module 30 includes eight pre-test antennas 31, and the antenna holder 35 includes five holding poles 351 equidistantly mounted on the holding base 353. The final test antenna 33 is mounted on a middle one of the five holding poles 351, and the pre-test antennas 31 are respectively mounted on the other four holding poles 351. Each of the other four holding poles 351 holds two of the pre-test antennas 31.

In use, all of the pre-test antenna 31 and the final test antenna 33 are polarized. Because the electronic device 200 may generate electromagnetic radiation in different polarization types (e.g., vertical polarization and horizontal polarization), the pre-test antenna 31 and the final test antenna 33 are respectively polarized in different types, and thus are used to respectively receive the electromagnetic radiation in the different polarization types. In the polarization process, ones of the pre-test antennas 31 that are all mounted on the same one of the holding poles 351 are polarized to have the same polarity, and every two of all test antennas of the test antenna module 30 (i.e., including the pre-test antennas 31 and the final test antenna 33) that are respectively mounted on two adjacent ones of the holding poles 351 are polarized to have different polarities. For example, as shown in FIG. 3, the final test antenna 33 is horizontally polarized, the four pre-test antennas 31 mounted on the two holding poles 351 positioned adjacent to the middle holding pole 351 (i.e., the holding pole 351 holding the final test antenna 31) are vertically polarized, and the four pre-test antennas 31 mounted on the two holding poles 351 that are respectively positioned at two ends of the holding base 353 are horizontally polarized. In this way, ones of all test antennas of the test antenna module 30 (i.e., including the pre-test antennas 31 and the final test antenna 33) that are respectively mounted on adjacent ones of the holding poles 351 can be prevented from interfering with each other (e.g., coupling with each other) when receiving wireless signals from the electronic device 100.

After polarization, heights of the pre-test antennas 31 on the holding poles 351 are adjusted to predetermined values. Ones of the pre-test antennas 31 that are respectively mounted on two adjacent ones of the holding poles 351 should be adjusted to different heights, and the longest practical distance should be set between ones of the pre-test antennas 31 which share the same one of the holding poles 351. In this way, when the test antenna module 30 receives wireless signals from the electronic device 100, electromagnetic interferences generated between the pre-test antennas 31 (e.g., coupling with each other) can be decreased as much as possible.

Accordingly, as shown in FIG. 3, in this embodiment, the two pre-test antennas 31 both mounted on one of the two holding poles 351 positioned adjacent to the middle holding pole 351 are respectively adjusted to heights of 1 m and 3 m, and the two pre-test antennas 31 both mounted on the other of the two holding poles 351 positioned adjacent to the middle holding pole 351 are respectively adjusted to heights of 2 m and 4 m. The two pre-test antennas 31 both mounted on the holding pole 351 positioned at one end of the holding base 353 and proximate to the holding pole 351 with the two basic antennas at the heights of 1 m, 3 m are respectively adjusted to heights of 2 m, 4 m. The two pre-test antennas 31 both mounted on the holding pole 351 positioned at the other end of the holding base 353 and proximate to the holding pole 351 with the two basic antennas at the heights of 2 m, 4 m are respectively adjusted to heights of 1 m, 3 m. Thus, the four vertically polarized ones of the pre-test antennas 31 are respectively positioned at different heights (i.e., 1 m, 2 m, 3 m, 4 m), and the four horizontally polarized ones of the pre-test antennas 31 are also respectively positioned at different heights (i.e., 1 m, 2 m, 3 m, 4 m).

When the pre-test antennas 31 have been adjusted to the predetermined heights, the rotation unit 10 with the electronic device 200 positioned thereon is positioned at a circle center of the holding base 353, such that distances between the electronic device 200 and each of the holding poles 351 equal each other. Thus, the electronic device 200 is used according to typical methods, and all of the pre-test antennas 31 receive wireless signals (i.e., electromagnetic radiation) sent from the electronic device 200. At the same time, the main processor 90 controls the rotation unit 10 with the electronic device 200 to rotate, thereby adjusting signal emitting angles of the electronic device 200 relative to the pre-test antennas 31 and enhancing power of the wireless signals sent to the pre-test antennas 31. After the rotation unit 10 and the electronic device 200 rotate at least one circle, each of the pre-test antennas 31 receives wireless signals sent from all signal emitting angles (i.e., 0-360 degrees) by the electronic device 200. Thus, all signals received by the pre-test antennas 31 are respectively amplified by the test signal amplifiers 80 corresponding to the pre-test antennas 31, and then are respectively transmitted to the pre-test units 50.

Each of the pre-test units 50 analyzes the signals received by the pre-test antenna 31 corresponding to the pre-test unit 50 to find the strongest one of the signals (i.e., the one of the signals with maximum power) received by the pre-test antenna 31 corresponding to the pre-test unit 50, and transmits the strongest signal to the main processor 90. Since the final test antenna 33 is horizontally polarized now, the main processor 90 first compares the strongest signals respectively received by the four horizontally polarized pre-test antennas 31 with each other, and finds the strongest one of all of the signals received by the four horizontally polarized pre-test antennas 31. Thus, the main processor 90 measures a frequency of the strongest one of all of the signals received by the four horizontally polarized pre-test antennas 31, and records this frequency as a working frequency in which the electronic device 200 may generate excessive electromagnetic radiation in the horizontal polarization type. A height of the one of the four horizontally polarized pre-test antennas 31 that receives the strongest one of all of the signals received by the four horizontally polarized pre-test antennas 31 is also recorded (e.g., by the main processor 90).

Finally, a height of the final test antenna 33 is adjusted to the same height as the one of the four horizontally polarized pre-test antennas 31 that receives the strongest one of all of the signals received by the four horizontally polarized pre-test antennas 31. The main processor 90 controls the rotation unit 10 with the working electronic device 200 to rotate, thereby adjusting signal emitting angles of the electronic device 200 relative to the final test antennas 33 and enhancing power of the wireless signals sent to the final test antenna 33. After the rotation unit 10 and the electronic device rotate at least one circle, the final test antenna 33 receives wireless signals sent from all signal emitting angles (i.e., 0-360 degrees) by the electronic device 200. The signals received by the final test antenna 33 are amplified by the test signal amplifier 80 corresponding to the final test antenna 33, and then are transmitted to the final test unit 70. The final test unit 70 selects signals at the frequency recorded by the main processor 90 (i.e., the working frequency in which the electronic device 200 may generate excessive electromagnetic radiation in the horizontal polarization type) in all of the signals received by the final test antenna 33, and transmits the selected signals at the recorded frequency to the main processor 90. The main processor 90 determines whether power of the signals at the recorded frequency exceeds a predetermined acceptable range. If the power of any of the signals at the recorded frequency exceeds the acceptable range, the main processor 90 determines that the electronic device 200 generates excessive electromagnetic radiation in the horizontal polarization type.

After the aforementioned process of determining whether the electronic device 200 generates excessive electromagnetic radiation in the horizontal polarization type, the electromagnetic radiation measuring device 100 is further used to determine whether the electronic device 200 generates excessive electromagnetic radiation in the vertical polarization type. In particular, the main processor 90 compares the strongest signals respectively received by the four vertically polarized pre-test antennas 31 with each other, and finds the strongest one of all of the signals received by the four vertically polarized pre-test antennas 31. Thus, the main processor 90 measures a frequency of the strongest one of all of the signals received by the four vertically polarized pre-test antennas 31, and records this frequency as a working frequency in which the electronic device 200 may generate excessive electromagnetic radiation in the vertical polarization type. A height of the one of the four vertically polarized pre-test antennas 31 that receives the strongest one of all of the signals received by the four vertically polarized pre-test antennas 31 is also recorded (e.g., by the main processor 90).

The final test antenna 33 is then vertically polarized, and a height of the final test antenna 33 is adjusted to the same height as the one of the four vertically polarized pre-test antennas 31 that receives the strongest one of all of the signals received by the four vertically polarized pre-test antennas 31. The main processor 90 controls the rotation unit 10 with the working electronic device 200 to rotate, thereby adjusting signal emitting angles of the electronic device 200 relative to the final test antennas 33 and enhancing power of the wireless signals sent to the final test antenna 33. After the rotation unit 10 and the electronic device 200 rotate at least one circle, the final test antenna 33 receives wireless signals sent from all signal emitting angles (i.e., 0-360 degrees) by the electronic device 200. The signals received by the final test antenna 33 are amplified by the test signal amplifier 80 corresponding to the final test antenna 33, and then are transmitted to the final test unit 70. The final test unit 70 selects signals at the frequency recorded by the main processor 90 (i.e., the working frequency in which the electronic device 200 may generate excessive electromagnetic radiation in the vertical polarization type) in all of the signals received by the final test antenna 33, and transmits the selected signals at the recorded frequency to the main processor 90. The main processor 90 determines whether power of the signals at the recorded frequency exceeds a predetermined acceptable range. If the power of any of the signals at the recorded frequency exceeds the acceptable range, the main processor 90 determines that the electronic device 200 generates excessive electromagnetic radiation in the vertical polarization type.

In the aforementioned process of determining whether the electronic device 200 generates excessive electromagnetic radiation in the vertical polarization type, when the final test antenna 33 is vertically polarized, the final test antenna 33 has the same polarity as that of the four pre-test antennas 31 positioned adjacent to the final test antenna 33. Therefore, when the vertically polarized final test antenna 33 is receiving wireless signals from the electronic device 200, the four pre-test antennas 31 positioned adjacent to the final test antenna 33 (i.e., the four vertically polarized pre-test antennas 31) can be turned off to prevent electromagnetic interferences (e.g., coupling with each other) generated between the final test antenna 33 and the four pre-test antennas 31. The others four pre-test antennas 31 can also be turned off to further prevent electromagnetic interferences. Furthermore, the pre-test antennas 31 and the final test antenna 33 mounted on the holding poles 351 can be configured to be rotatable, such that the polarities of the pre-test antennas 31 and the final test antenna 33 can be easily adjusted by means of rotating the pre-test antennas 31 and the final test antenna 33.

The present disclosure uses the test antenna module 30, which includes test antennas respectively having predetermined polarities and positioned at predetermined different heights, to measure electromagnetic radiation of electronic devices, such as the electronic device 200. The present disclosure does not require the frequent adjustment of heights of the pre-test antennas 31 and of the final test antenna 33, and in another embodiment electromagnetic radiation can be detected and measured in both the vertical and the horizontal polarization types and at different heights during a single rotation of the electronic device 200. In comparison with other methods for measuring the electromagnetic radiation of electronic devices, the present disclosure can be operated more easily and in a shorter time.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. An electromagnetic radiation measuring device for an electronic device, comprising:
    a test antenna module including a plurality of pre-test antennas and at least one final test antenna, the pre-test antennas and the final test antenna having predetermined polarities and positioned at predetermined heights respectively; and
    a main processor electrically connected to the test antenna module; wherein the pre-test antennas and the final test antenna respectively receive wireless signals sent from the electronic device, the main processor measures and records a frequency of a strongest wireless signal received by selected ones of the pre-test antennas that have a same polarity, and further determines whether power of wireless signals at the recorded frequency received by the final test antenna polarized to have the same polarity as that of the selected ones of the pre-test antennas exceeds a predetermined acceptable range.

2. The electromagnetic radiation measuring device as claimed in claim 1, wherein the main processor further records a height of the one of the selected pre-test antennas having the same polarity that receives the strongest wireless signal from the electronic device, and the final test antenna is positioned at the recorded height to receive the wireless signals from the electronic device.

3. The electromagnetic radiation measuring device as claimed in claim 1, wherein some of the pre-test antennas are vertically polarized and the others of the pre-test antennas are horizontally polarized; the main processor measures and records both a frequency of the strongest wireless signal received by the vertically polarized pre-test antennas and a frequency of the strongest wireless signal received by the horizontally polarized pre-test antennas.

4. The electromagnetic radiation measuring device as claimed in claim 3, wherein when the final test antenna is vertically polarized, the main processor determines whether power of wireless signals at the recorded frequency of the strongest wireless signal received by the vertically polarized pre-test antennas received by the final test antenna exceeds one predetermined acceptable range; and when the final test antenna is horizontally polarized, the main processor determines whether power of wireless signals at the recorded frequency of the strongest wireless signal received by the horizontally polarized pre-test antennas received by the final test antenna exceeds another predetermined acceptable range.

5. The electromagnetic radiation measuring device as claimed in claim 1, wherein the pre-test antennas are turned off when the final test antenna receives the wireless signals from the electronic device.

6. The electromagnetic radiation measuring device as claimed in claim 1, wherein the test antenna module further includes an antenna holder; the antenna holder including a plurality of holding poles, the pre-test antennas and the final test antenna mounted on the holding poles, and heights of the pre-test antennas and the final test antenna on the holding poles being adjustable.

7. The electromagnetic radiation measuring device as claimed in claim 6, wherein the pre-test antennas and the final test antenna are rotatably mounted on the holding poles, such that polarities of the pre-test antennas and the final test antenna can be adjusted by means of rotating the pre-test antennas and the final test antenna.

8. The electromagnetic radiation measuring device as claimed in claim 6, wherein the holding base being arc-shaped, and the holding poles are equidistantly mounted on the holding base; the final test antenna mounted on one of the holding poles, and the pre-test antennas equally mounted on the others of the holding poles.

9. The electromagnetic radiation measuring device as claimed in claim 8, further comprising a rotation unit for positioning the electronic device; the main processor electrically connected to the rotation unit to control the rotation unit with the electronic device to rotate, thereby adjusting signal emitting angles of the electronic device relative to the pre-test antennas and the final test antenna and enhancing power of the wireless signals sent to the pre-test antennas and the final test antenna.

10. The electromagnetic radiation measuring device as claimed in claim 9, wherein the rotation unit is positioned at a circle center of the holding base, such that distances between the electronic device positioned on the rotation unit and each of the holding poles equal each other.

11. The electromagnetic radiation measuring device as claimed in claim 1, further comprising a plurality of pre-test units corresponding to the pre-test antennas; each of the pre-test antennas electrically connected to the main processor through a corresponding one of the pre-test units; each of the pre-test units analyzing the wireless signals received by a corresponding one of the pre-test antennas to find the strongest signal received by the corresponding pre-test antenna, and transmitting the strongest signal received by the corresponding pre-test antenna to the main processor; the main processor comparing the strongest signals respectively received by the selected ones of the pre-test antennas having the same polarity with each other, thereby finding the strongest signal received by the selected pre-test antennas having the same polarity.

12. The electromagnetic radiation measuring device as claimed in claim 11, further comprising at least one final test unit corresponding to the final test antenna; the final test antenna electrically connected to the main processor through the final test unit, and the final test unit selecting the wireless signals at the recorded frequency received by the final test antenna and transmitting the selected signals to the main processor.

13. The electromagnetic radiation measuring device as claimed in claim 12, further comprising a plurality of test signal amplifiers corresponding to the pre-test antennas and the final test antenna, each of the pre-test antennas is electrically connected to a corresponding one of the pre-test units through a corresponding one of the test signal amplifiers, and the final test antenna is also electrically connected to the final test unit through a corresponding one of the test signal amplifiers.

* * * * *